United States Patent
Chiba et al.

(10) Patent No.: US 12,046,446 B2
(45) Date of Patent: Jul. 23, 2024

(54) CHARGED PARTICLE BEAM DEVICE

(71) Applicant: Hitachi High-Tech Corporation, Tokyo (JP)

(72) Inventors: Hiroyuki Chiba, Tokyo (JP); Wei Chean Tan, Tokyo (JP); Ryo Komatsuzaki, Tokyo (JP); Hirofumi Sato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 324 days.

(21) Appl. No.: 17/640,279

(22) PCT Filed: Sep. 4, 2019

(86) PCT No.: PCT/JP2019/034683
§ 371 (c)(1),
(2) Date: Mar. 3, 2022

(87) PCT Pub. No.: WO2021/044532
PCT Pub. Date: Mar. 11, 2021

(65) Prior Publication Data
US 2022/0344124 A1  Oct. 27, 2022

(51) Int. Cl.
*H01J 37/22* (2006.01)
*G06T 7/70* (2017.01)
(Continued)

(52) U.S. Cl.
CPC .............. *H01J 37/222* (2013.01); *G06T 7/70* (2017.01); *G06V 10/22* (2022.01); *G06V 10/245* (2022.01);
(Continued)

(58) Field of Classification Search
None
See application file for complete search history.

(56) References Cited

U.S. PATENT DOCUMENTS

2003/0118149 A1* 6/2003 Okuda ................. G01N 23/225
378/58
2005/0121612 A1* 6/2005 Okuda ................. G01N 23/225
250/311
(Continued)

FOREIGN PATENT DOCUMENTS

JP  2003-107022 A      4/2003
JP  2003107022 A  *  4/2003  .......... G01N 23/225
(Continued)

OTHER PUBLICATIONS

International Search Report (PCT/ISA/210) issued in PCT Application No. PCT/JP2019/034683 dated Nov. 26, 2019 with English translation (six (6) pages).
(Continued)

*Primary Examiner* — Andrew Smyth
(74) *Attorney, Agent, or Firm* — Crowell & Moring LLP

(57) ABSTRACT

A charged particle beam device 100 includes: an irradiation unit 110 configured to irradiate a sample S with a charged particle beam; a particle detection unit 130 configured to detect a particle caused by the irradiation of the sample with the charged particle beam; and a control unit 151 configured to generate an image of the sample based on an output from the particle detection unit, wherein the control unit 151 inputs the image of the sample S into models M1 and M2 for detecting a first structure 401 and a second structure 402, acquires a first detection result related to the first structure 401 and a second detection result related to the second structure 402 from the models M1 and M2, determines locations or regions of the first structure 401 and the second structure 402 based on the first detection result and the second detection result, and outputs an integration result image 203 representing the location or the region of the first
(Continued)

structure 401 and the location or the region of the second structure 402.

13 Claims, 8 Drawing Sheets

(51) Int. Cl.
    *G06V 10/22*     (2022.01)
    *G06V 10/24*     (2022.01)
    *G06V 10/774*     (2022.01)
    *H01J 37/244*     (2006.01)
    *H01J 37/28*     (2006.01)

(52) U.S. Cl.
    CPC .......... *G06V 10/774* (2022.01); *H01J 37/244* (2013.01); *H01J 37/28* (2013.01); *G06T 2207/10061* (2013.01); *G06T 2207/20081* (2013.01); *H01J 2237/221* (2013.01); *H01J 2237/24578* (2013.01); *H01J 2237/2814* (2013.01)

(56) References Cited

U.S. PATENT DOCUMENTS

| | | | |
|---|---|---|---|
| 2014/0307946 A1* | 10/2014 | Nakahira | G06T 7/0004 382/149 |
| 2015/0348750 A1* | 12/2015 | Obara | H01J 37/06 250/307 |
| 2017/0200290 A1* | 7/2017 | Bhattiprolu | G06T 7/246 |
| 2020/0278303 A1 | 9/2020 | Tada et al. | |

FOREIGN PATENT DOCUMENTS

| | | | | |
|---|---|---|---|---|
| JP | 2014-207110 A | | 10/2014 | |
| JP | 2014207110 A | * | 10/2014 | ........... G03F 7/7065 |
| JP | 2019-60741 A | | 4/2019 | |
| JP | 2019060741 A | * | 4/2019 | ......... G01N 21/8803 |
| WO | WO 2014/104191 A1 | | 7/2014 | |
| WO | WO-2014104191 A1 | * | 7/2014 | ........... G01N 23/225 |
| WO | WO-2017014194 A1 | * | 1/2017 | ............. G01N 23/04 |
| WO | WO-2019065607 A1 | * | 4/2019 | ......... G01N 21/8803 |

OTHER PUBLICATIONS

Japanese-language Written Opinion (PCT/ISA/237) issued in PCT Application No. PCT/JP2019/034683 dated Nov. 26, 2019 (seven (7) pages).
Japanese-language International Preliminary Report on Patentability (PCT/IPEA/409) issued in PCT Application No. PCT/JP2019/034683 dated Aug. 12, 2020, including Annexes with partial English translation (17 pages).
Chinese-language Office Action issued in Chinese Application No. 201980099996.7 dated Mar. 1, 2024 (9 pages).

* cited by examiner

[FIG. 1]
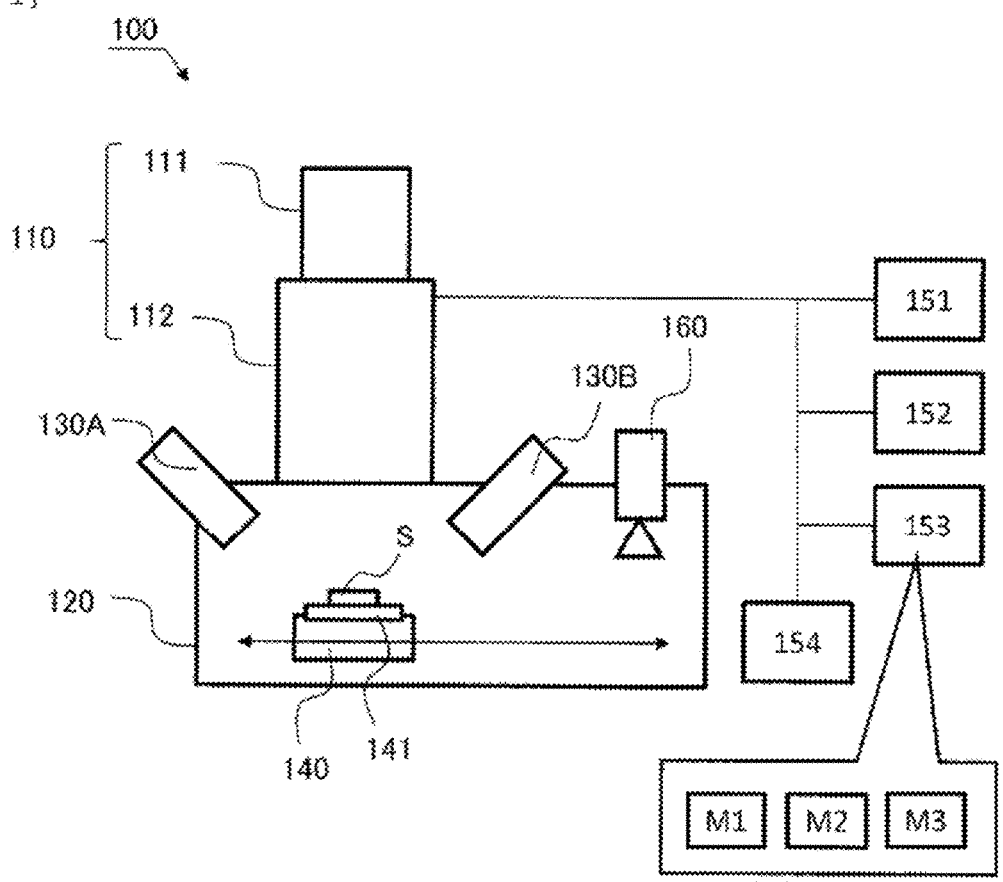

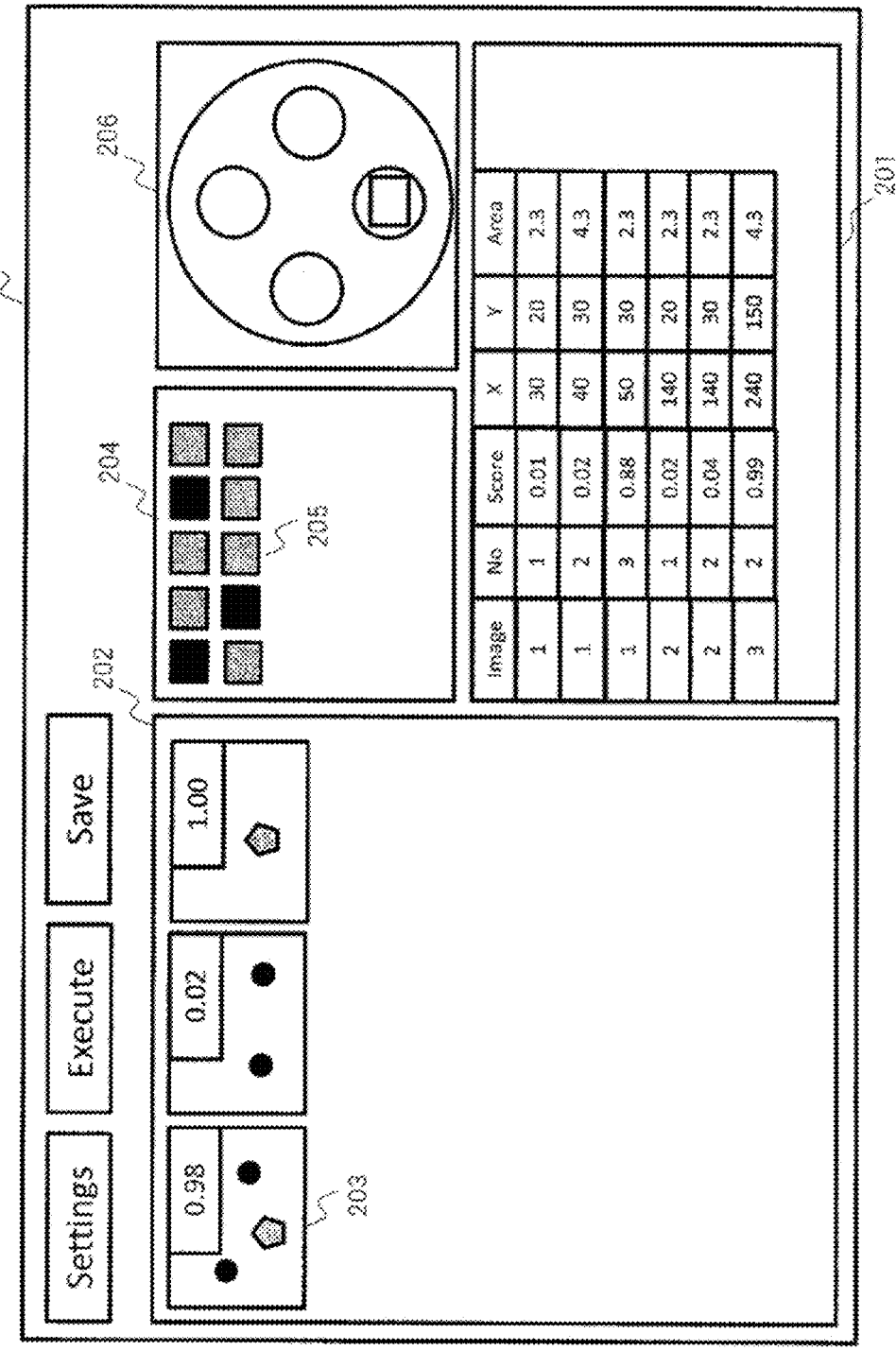
[FIG. 2]

[FIG. 3]
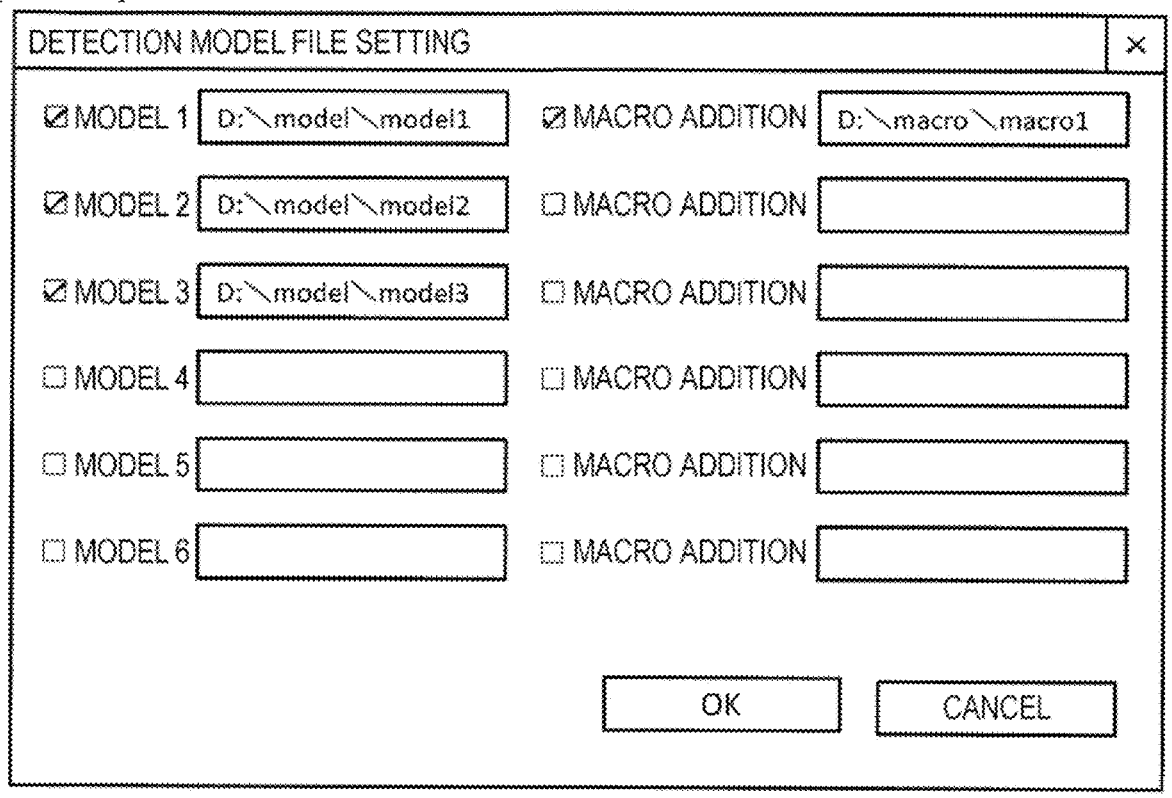

[FIG. 5]
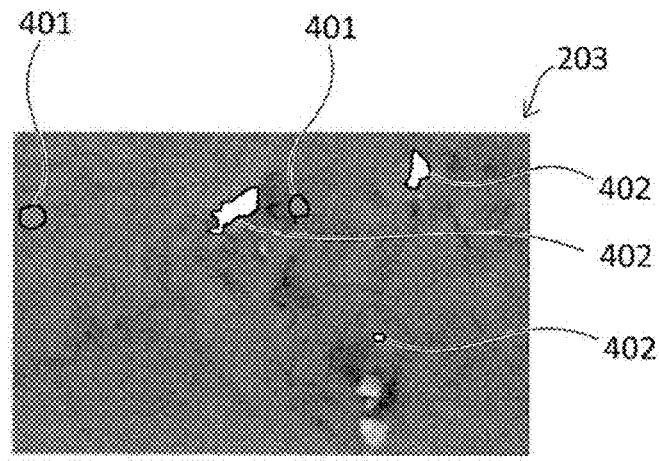
[FIG. 6]
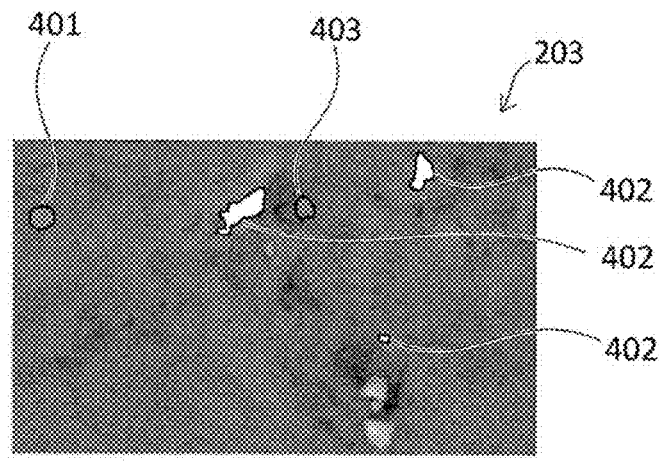

[FIG. 7]
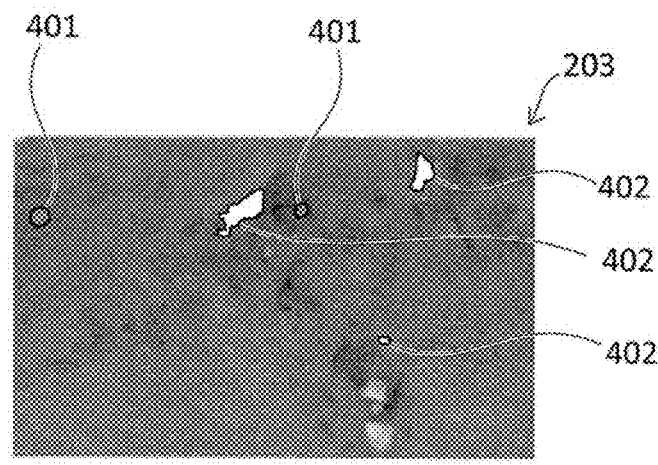
[FIG. 8]
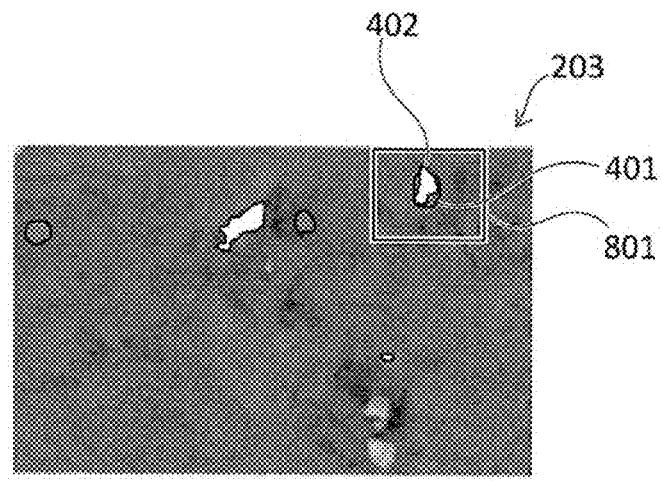

[FIG. 9]
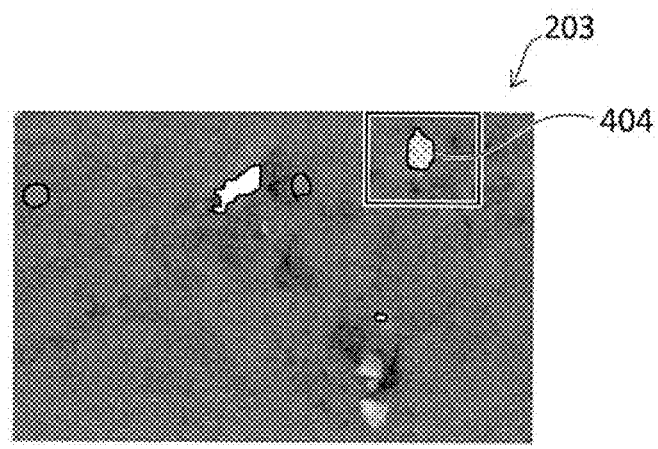
[FIG. 10]
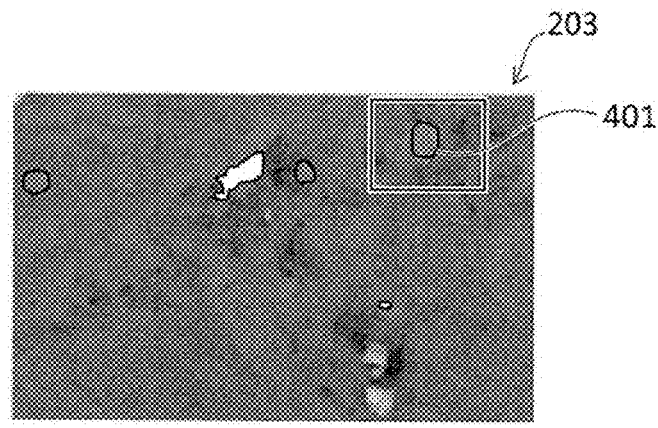

[FIG. 11]
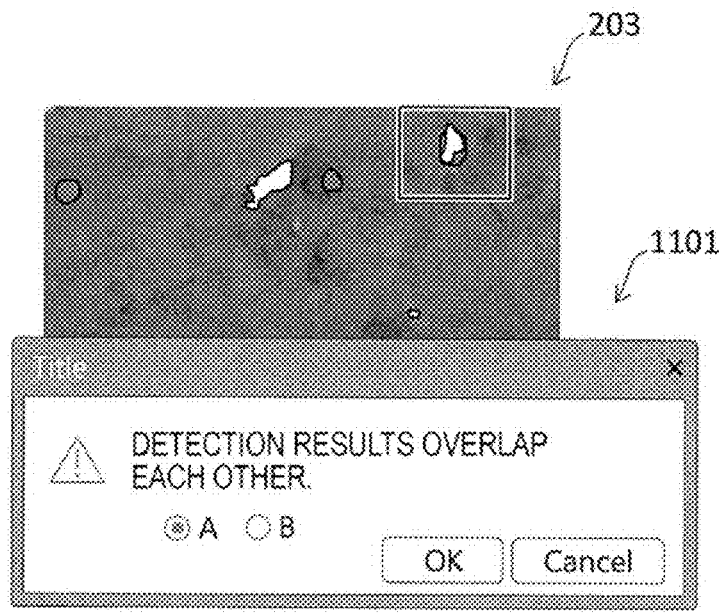
[FIG. 12]
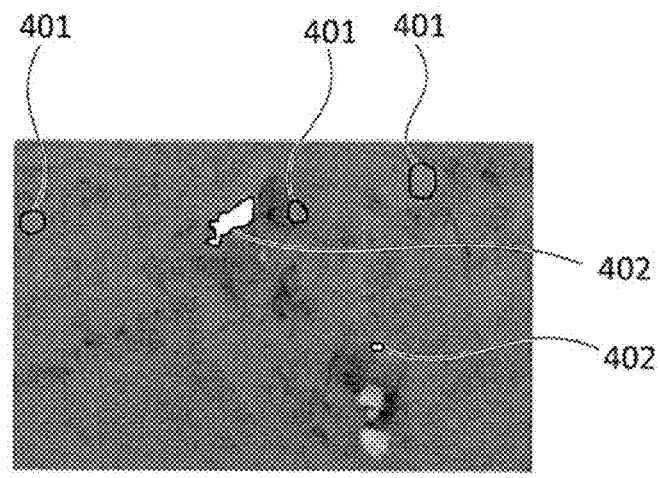

CHARGED PARTICLE BEAM DEVICE

TECHNICAL FIELD

The present invention relates to a charged particle beam device.

BACKGROUND ART

A charged particle beam device is used to detect and/or evaluate an object of interest in a sample. The charged particle beam device irradiates the sample with a charged particle beam and detects and/or evaluates the object of interest by using a signal generated by the irradiation. An example of such a charged particle beam device is disclosed in JP-A-2019-60741 (PTL 1).

CITATION LIST

Patent Literature

PTL 1: JP-A-2019-60741

SUMMARY OF INVENTION

Technical Problem

However, even though related art is effective for detecting a certain specific structure, there is a problem that the related art is difficult to perform a process when different types of structures are mixed. For example, a trained model, which is trained to detect a particle having a certain shape, may not be suitable for detecting a mixed particle having another shape, a foreign substance which is not a particle, and the like.

The present invention has been made in an effort to solve the above-described problems, and an object thereof is to provide a charged particle beam device capable of appropriately detecting different types of structures.

Solution to Problem

An example of a charged particle beam device according to the present invention includes:
  an irradiation unit configured to irradiate a sample with a charged particle beam;
  a particle detection unit configured to detect a particle caused by the irradiation of the sample with the charged particle beam;
  an image generation unit configured to generate an image of the sample based on an output from the particle detection unit; and
  a structure detection unit, wherein
  the structure detection unit
  inputs the image of the sample into a first trained model for detecting a first structure,
  inputs the image of the sample into a second trained model for detecting a second structure,
  acquires a first detection result related to the first structure from the first trained model,
  acquires a second detection result related to the second structure from the second trained model,
  determines a location or a region of the first structure based on the first detection result,
  determines a location or a region of the second structure based on the second detection result, and
  outputs integration result information representing the location or the region of the first structure and the location or the region of the second structure.

Advantageous Effects of Invention

A charged particle beam device according to the present invention can detect a plurality of corresponding types of structures by using a plurality of trained models.

BRIEF DESCRIPTION OF DRAWINGS

FIG. 1 is a front view schematically showing a charged particle beam device according to a first embodiment of the present invention.

FIG. 2 is an example of a GUI showing an example of an integration result image displayed on a display unit.

FIG. 3 is an example of a GUI for selecting a trained model displayed on the display unit.

FIG. 5 is an example of an integration result image using different colors for each structure.

FIG. 6 is an example of an integration result image using the same representation for a plurality of structures.

FIG. 7 is an example of an integration result image using an image process.

FIG. 8 is an example of an integration result image in which a rectangular frame is displayed for overlapping structures.

FIG. 9 is a diagram showing a state in which an example of a correction process during overlapping is executed in the integration result image of FIG. 8 and a new structure is displayed.

FIG. 10 is a diagram showing a state in which an example of a correction process during overlapping is executed in the integration result image of FIG. 8 and one structure is prioritized.

FIG. 11 is a diagram showing a state in which an example of a correction process during overlapping is executed in the integration result image of FIG. 8 and a process of receiving an operation of selecting any one of the respective structures is performed.

FIG. 12 is a diagram schematically showing an example of teacher data generated based on the selected structure.

DESCRIPTION OF EMBODIMENTS

Figure 4A:
FIGS. 4A to 4C are diagrams showing a process of each trained model.

Hereinafter, embodiments of the present invention will be described with reference to the accompanying drawings.

First Embodiment

<About Configuration of Charged Particle Beam Device 100>

FIG. 1 is a front view schematically showing a charged particle beam device 100 according to a first embodiment. The charged particle beam device 100 is a scanning electron microscope. However, the charged particle beam device may be other charged particle beam devices such as a transmission electron microscope, an ion beam device, and the like. It should be noted that a configuration of the charged particle beam device 100 is only an example. In other words, a specific configuration of each unit of the charged particle beam device 100 may vary depending on a type of the charged particle beam device 100 and a structure thereof.

The charged particle beam device 100 includes an irradiation unit 110 that irradiates a sample S with a charged particle beam. The irradiation unit 110 of this example includes an electron source 111 and a lens barrel 112. The electron source 111 emits an electron which becomes a source of the charged particle beam (an electron beam in this example). The lens barrel 112 includes a focusing lens, a scanning coil, an objective lens, and the like, and guides the charged particle beam toward the sample S.

The irradiation unit 110 is connected to a sample chamber 120. Typically, the sample chamber 120 is evacuated by a vacuum pump which is not shown.

In this example, the sample chamber 120 includes a detection unit 130 that outputs a signal caused by the irradiation of the sample S with the charged particle beam. A target to be detected by the detection unit 130 may be a secondary electron, a reflected electron, an X-ray, an Auger electron, and the like. Further, a plurality of detection units 130 may be provided therein.

The detection unit 130 includes a particle detection unit that detects a particle caused by the irradiation of the sample S with the charged particle beam. The particle detection unit is, for example, a first detection unit 130A that detects the secondary electron. Further, the detection unit 130 may include an electromagnetic wave detection unit that detects an electromagnetic wave caused by the irradiation of the sample S with the charged particle beam. The electromagnetic wave detection unit is, for example, a second detection unit 130B that detects the X-ray. The detection unit 130 is not necessarily provided in the sample chamber 120. As an example, in a kind of scanning electron microscope, the detection unit 130 is provided inside the lens barrel 112. As another example, in a kind of transmission electron microscope, the detection unit 130 is provided downstream of a flow of an electron beam from the sample S so as to detect the electron beam transmitted through the sample S.

The charged particle beam device 100 includes a stage 140. The stage 140 may be a movable stage. Typically, the stage 140 may be movable in an X direction and/or a Y direction (one direction in a plane perpendicular to an optical axis of the charged particle beam: an arrow direction in FIG. 1). Further, the stage 140 may be movable in a Z direction (a direction perpendicular to the optical axis of the charged particle beam). Further, the stage 140 may be rotatable (rotation with a Z-axis direction as a rotation axis). Further, the stage 140 may be tiltable (rotation with the X direction or the Y direction as a rotation axis). The stage 140 may be configured to support a sample holder 141. In this example, the sample S is placed on the sample holder 141.

The charged particle beam device 100 may be connected to a control unit 151, an input unit 152, a storage unit 153, and a display unit 154. The control unit 151, the input unit 152, the storage unit 153, and the display unit 154 may be a part of the charged particle beam device 100 or may be independent of the charged particle beam device 100. The connection between the units may be a wired connection or a wireless connection. Therefore, a connection line shown in FIG. 1 is only an example. As an addition or an alternative, a connection via a communication line such as the Internet and the like can also be adopted. For example, the storage unit 153 may be the storage unit 153 on an intranet, the Internet, or a cloud service. When the charged particle beam device 100 is connected to the control unit 151 or the storage unit 153 of a plurality of layers, the control unit 151 or the storage unit 153 provided in an upper layer may be referred to as an upper device.

In the typical charged particle beam device 100, the control unit 151 receiving the signal from the detection unit 130 can generate an image or a spectrum. Alternatively, the control unit 151 can analyze or evaluate a location or a region where the sample S is irradiated with the charged particle beam (hereinafter, both the location and the region are collectively referred to as a "region" in the specification). In this example, the control unit 151 can generate an SEM image (here, a secondary electron image) based on a signal output by the first detection unit 130A. In the same manner, the control unit 151 can generate an X-ray analysis image or a spectrum based on a signal output by the second detection unit 130B. Therefore, the control unit 151 functions as an image generation unit that generates an image of the sample S based on the output from the detection unit 130. Further, the control unit 151 can analyze or evaluate, for example, a surface shape or a surface element of the sample S based on these images or signals.

An input of information to the charged particle beam device 100 or an output of information from the charged particle beam device 100 may be performed via a UI (user interface). In this example, the UI is a GUI (graphic user interface) and is displayed on the display unit 154.

The control of the charged particle beam device 100, the generation of the image or the spectrum, or the analysis or evaluation of the sample S may be performed by the control unit 151 based on a trained model stored in the storage unit 153. The storage unit 153 stores a plurality of trained models. In the embodiment, the storage unit 153 stores a model M1 (a first trained model), a model M2 (a second trained model), and a model M3 (a third trained model), and the number of trained models stored therein may be two or four or more.

Each trained model is configured to detect different structures by performing machine learning using different teacher data. More specifically, the model M1 is a model for detecting a first structure, the model M2 is a model for detecting a second structure, and the model M3 is a model for detecting a third structure. The structure indicates, for example, a shape of a particle (a spherical shape, a specific crystal shape, and the like), a shape of a foreign substance, and a shape on the sample S (a scratch and the like). Further, the structure is not limited to an appearance shape, and may include a structure of a portion having specific composition.

Further, it is not necessary for each structure to be specialized in different types of substances and the like, and each corresponding model may be configured to detect a plurality of structures that can be owned by the same type of substance and the like. For example, in a case where a certain substance appears as a round particle or an angular particle on the sample S, when a certain model is trained for a round structure and another model is trained for an angular structure, the same type of particles can be detected by a plurality of models.

The control unit 151 may control an overall operation of the charged particle beam device 100. The control unit 151 may implement this control by executing a program. This program may be stored in the storage unit 153 or may be stored in a storage device in the control unit 151 independent of the storage unit 153.

The charged particle beam device 100 may further include a navigation image capturing device 160. The navigation image capturing device 160 captures a navigation image 206 (described later). In the example of FIG. 1, the navigation image capturing device 160 is provided in the sample chamber 120. In FIG. 1, when the stage 140 is located at a right end of the arrow in FIG. 1, the navigation image capturing device 160 can capture at least a part of a portion where the sample holder 141 is expected to exist. In the example of FIG. 1, the navigation image capturing device 160 is an optical camera, and can capture the whole portion where the sample holder 141 is expected to exist. A light source for the navigation image capturing device 160 may be provided in the sample chamber 120.

In a manner different from that of the example of FIG. 1, an image acquisition device other than the optical camera may be used as the navigation image capturing device 160. Further, in a manner different from that of the example of FIG. 1, the navigation image capturing device 160 that is independent of the charged particle beam device 100 may be used. For example, as the navigation image capturing device 160, an optical microscope that is independent of the charged particle beam device 100 and that can fix the sample holder 141 at a fixed location and in a fixed direction may be used. Further, the navigation image capturing device 160 may also be connected to the control unit 151, the input unit 152, the storage unit 153, and the display unit 154.

The control unit 151 also functions as a structure detection unit for detecting a specific structure. The control unit 151, as the structure detection unit, detects the structure using the trained model based on the image of the sample S. More specifically, the control unit 151 inputs the image of the sample S to the model M1, acquires a detection result (a first detection result) related to the first structure from the model M1, and determines a location or a region of the first structure based on the first detection result.

In the same manner, the control unit 151 inputs the image of the sample S to the model M2, acquires a detection result (a second detection result) related to the second structure from the model M2, and determines a location or a region of the second structure based on the second detection result. Further, the control unit 151 inputs the image of the sample S to the model M3, acquires a detection result (a third detection result) related to the third structure from the model M3, and determines a location or a region of the third structure based on the third detection result.

Further, the control unit 151, as the structure detection unit, integrates information representing the location or the region of the respective structures (for example, the first structure, the second structure, and the third structure), and generates and outputs integration result information representing these locations or regions.

<About Information Output by Charged Particle Beam Device 100>

FIG. 2 is an example of a GUI displayed on the display unit 154. The GUI can be implemented as a screen 200 displayed on the display unit 154. The integration result information can be configured as an image to be displayed in the GUI. However, an output mode of the integration result information is not limited to the image, and may be represented in a table or other formats.

The screen 200 includes a tabular unit 201 and a superimposition unit 202. In the tabular unit 201, an evaluation result of the sample S is displayed in a table format. In the example of FIG. 2, with respect to each detected structure, an image number ("Image") corresponding to a region where the structure is included, a number ("No") that specifies the structure among the structures included in the region, an evaluation result related to the structure ("Score"), a location of the structure ("X" and "Y") and an area of the structure ("Area") are displayed.

In the superimposition unit 202, the evaluation result is displayed by being superimposed on the image of the sample S. In this example, a plurality of integration result images 203 are displayed on the superimposition unit 202. In each of the integration result images 203, the location of the first structure is indicated by a black circle and the location of the second structure is indicated by a gray pentagon while being superimposed on the image of the sample S. In this example, the third structure is not detected, and when the third structure is detected, the location of the third structure may be indicated by a corresponding figure.

With respect to each of the integration result images 203, the evaluation result related to each structure included in the image is displayed as a numerical value.

In this example, only the location of each structure is shown, and when each structure is a region having a shape, the region may be displayed by being superimposed on the integration result image 203. For example, a color of a pixel forming each structure may be changed to a specific color (for example, red or green). As an addition or an alternative, the pixel forming each structure (a region formed of the pixel) may be changed to specific luminance, may be changed to specific hatching, and/or may be changed to blinking in a specific pattern.

The screen 200 may include a map unit 204. A symbol 205 corresponding to each integration result image 203 is displayed on the map unit 204. A display mode of the symbol 205 changes according to the information related to each corresponding integration result image 203. The changes in display mode includes changes in shape, color, color tone, light and shade, size, location, and the like. In addition, the change in display mode includes a change in which two or more display modes can be visually distinguished, such as the above-described changes in luminance, hatching, blinking pattern, and the like.

For example, the shape of the symbol 205 (rectangle in this example) may be determined according to the shape of the integration result image 203, or, for example, may be the same as the shape of the integration result image 203. Further, the color or the light and shade of the symbol 205 may be determined according to an evaluation result related to a structure of interest included in the integration result image 203. Further, the size of the symbol 205 may be determined according to the size of the integration result image 203 in the sample S, or, for example, a relative size between the respective symbols 205 may be determined according to a relative size between the respective integration result images 203. Further, the location of the symbol 205 in the map unit 204 may correspond to the location of the integration result image 203 in the sample S.

Further, the screen 200 may include the navigation image 206. The navigation image 206 is an image for visually designating a search range in the sample S placed on the sample holder 141 by a user, and is typically captured by the navigation image capturing device 160. However, when an observation magnification of the charged particle beam device 100 can be set low enough, an image such as the SEM image and the like may be used as the navigation image 206. For example, the navigation image 206 can be used to set or display a search region of the sample S to be searched by the charged particle beam device 100.

<Specific Process Related to Trained Model>

FIG. 3 is another example of the GUI displayed on the display unit 154. This GUI is used to select the trained model. In the example of FIG. 3, information for specifying three models (for example, the models M1, M2, and M3) are input. The control unit 151 inputs the image of the sample S to each model specified here.

Further, information for specifying a macro to be used for each model can be input. In the example of FIG. 3, a macro is designated for the model M1, and no macro is designated for the models M2 and M3. The macro is, for example, a program for performing an image process, receives information output by the trained model as an image, and is used for performing a specific image process on this image.

Figure 4B:
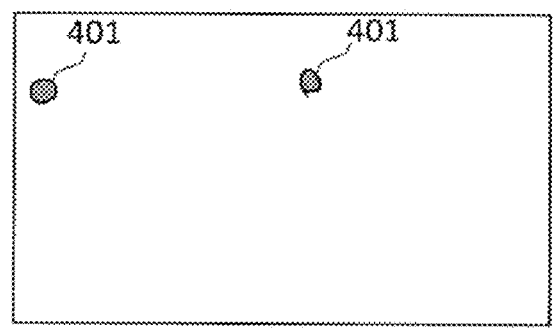
Figure 4C:
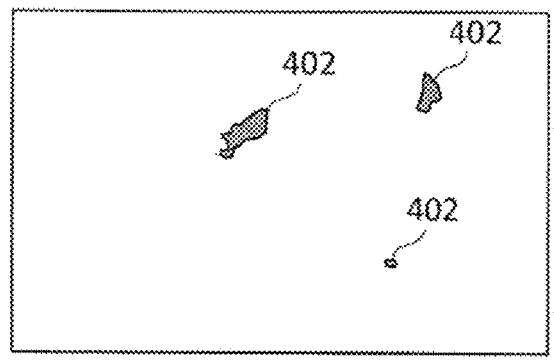

A process of each trained model will be described with reference to FIG. 4. (a) of FIG. 4 is an image of the sample S. The control unit 151 can generate such an image based on the signal from the detection unit 130. (b) of FIG. 4 represents a location or a region of the first structure 401 determined based on a detection result by the model M1. (c) of FIG. 4 represents a location or a region of the second structure 402 determined based on a detection result by the model M2. The illustration of the third structure is omitted, and a process thereof is performed in the same manner.

The output of each model is not required to be in a format directly shown in (b) or (c) of FIG. 4 (a format indicating a region in an image). For example, a certain model may output a heat map based on the image. The heat map represents, for example, possibility that a structure exists for each pixel (for example, reliability, probability, or likelihood). In this case, the control unit 151 performs, for example, an arithmetic operation including a binarization process based on the heat map, thereby making it possible to determine the location or the region of each structure as shown in (b) or (c) of FIG. 4.

<Display Example of Integration Result Image>

FIG. 5 shows an example of the integration result image 203 as an output example of the integration result information. The integration result image 203 represents a location or a region of a structure (for example, the first structure 401 and the second structure 402) detected by each trained model in the image of the sample S.

Each structure can be represented by using a different representation. For example, the control unit 151, as the structure detection unit, displays a first representation in the location or the region of the first structure 401 and a second representation in the location or the region of the second structure 402 in the image of the sample S, thereby generating and outputting the integration result image 203. For example, the integration result image 203 can be generated by displaying the first representation in the location or the region of the first structure 401 and displaying the second representation in the location or the region of the second structure 402. The first representation and the second representation may be displayed by being superimposed on the image of the sample S, or may be displayed by replacing a part of the image of the sample S.

Different representations can be achieved by using a different color, a different tone, a different light and shade, a different fill pattern (a vertical stripe, a horizontal stripe, a diagonal stripe, a dot pattern, a gradation, and the like), a different blinking state, and the like. As a more specific example, in the example of FIG. 5, the first representation for the first structure 401 is represented by a first color (that is, gray) and the second representation for the second structure 402 is represented by a second color (that is, white). When color display can be performed, the first structure 401 may be represented by, for example, red, and the second structure 402 may be represented by, for example, green.

As described above, the charged particle beam device 100 can detect the corresponding types of structures by using a plurality of trained models. Further, a user of the charged particle beam device 100 can easily identify each structure by using different representations for different structures.

FIG. 6 shows another example of the integration result image 203. It is not necessary to use different representations for the structures detected by all the trained models, and the same representation may be used for a plurality of or all of the trained models. In the example of FIG. 6, the first structure 401 detected via the model M1 and the third structure 403 detected via the model M3 are shown by the same representation (gray). In this manner, the integration result image 203 may be generated by further displaying the first representation or the second representation in the location or the region of the third structure 403 in the image of the sample S.

When a structure of a certain object is not limited to one, as described above, it is useful to use the same representation for a plurality of structures respectively detected by a plurality of trained models. For example, when a certain type of particle can have various shapes, respective assumed shapes are trained for different models and the same representation is used for all the structures detected by those models, which makes it easier to identify the particles.

FIG. 7 shows still another example of the integration result image 203. Before displaying a detection result of any structure on the image of the sample S, the image process may be performed on the detection result thereof. In the example of FIG. 7, the image process using the macro designated as shown in FIG. 3 is performed on a detection result related to the first structure 401, and as a result, a range of the first structure 401 becomes narrower than that shown in FIG. 5.

Specific contents of the image process can be appropriately designed by those skilled in the art, and for example, it is possible to perform a process of specifying a range (or a region) of the structure based on the image of the sample S and the location of each structure. For example, when the image of the sample S shows a location where a certain structure exists, the range (or the region) of the structure can be specified by performing an appropriate image process on a range (or a region in the vicinity thereof) including the location of the sample S. In this example, while the range (or the region) of the structure is specified by the image process, the image process may not be required to specify the range (or the region) of the structure and may be used to specify only the location thereof.

According to the image process, since the process of detecting the location or the region of each structure and the process of detecting the range of the structure can be separated from each other and each optimum process can be used, an appropriate processing result can be obtained as a whole. For example, the model M1 can appropriately detect the existence of the first structure 401, and when the range (or the region) thereof tends to be detected larger than an actual range, the range (or the region) thereof is detected by performing the image process, thereby making it possible to obtain an appropriate result for both the location and size. A specific content of the image process may vary depending on each structure (that is, for each trained model). As an image on which the image process is performed, a result image extracted by the machine learning may be used as a target, or the image of the sample S which is not extracted yet may be used.

As described above, the control unit 151, as the structure detection unit, determines the location or the region of the first structure 401 by performing the image process based on the image of the sample S and the first detection result. In the same manner, the control unit 151 may determine the location or the region of the second structure 402 by performing the image process based on the image of the sample S and the second detection result. When the third structure is detected, the control unit 151 may determine the location or the region of the third structure by performing the image process based on the image of the sample S and the third detection result.

Depending on the detection result of each structure, the charged particle beam device 100 may perform further process on the sample S. For example, the sample S may be analyzed for a location or a region corresponding to the location or the region of each structure (the first structure, the second structure, or third structure). The analysis of the sample S may include shape analysis or composition analysis. For example, the location or the region where the first structure 401 is detected (for example, the location or the region corresponding to the image of (a) of FIG. 4) may be further irradiated with the charged particle beam via the irradiation unit 110, and a signal caused by the irradiation may be detected via the detection unit 130.

The signal according to this analysis may be, for example, a signal based on an electron generated when the sample S is irradiated with the charged particle beam, or may be a signal based on an X-ray generated when the sample S is irradiated with the charged particle beam. Particularly, when the detection of each structure is executed by the signal based on the electron and the analysis of each structure is executed by the signal based on the X-ray, the search can be efficiently performed, and the analysis can be performed with high accuracy. For the analysis, for example, high-magnification image capturing using energy dispersive X-ray spectroscopy (EDS) or electron backscatter diffraction (EBSD) can be used. Further, a charged particle beam having a high acceleration or a large current may be used for image capturing.

<About Specific Example of Signal Acquisition Based on X-Rays>

Depending on the detection result of each structure based on each model, whether or not to execute the X-ray analysis may be selected. For example, when the model M1 is a model for detecting a foreign substance desired to specify an element, and the model M2 is a model for detecting something other than the foreign substance, the execution of unnecessary X-ray analysis can be eliminated by executing the X-ray analysis only for the model M1 such that the analysis can be efficiently performed.

FIG. 8 shows still another example of the integration result image 203. Inside a rectangular frame 801, a location or a region of the first structure 401 and a location or a region of the second structure 402 overlap each other. Here, the meaning indicating that "the locations or the regions overlap each other" can be appropriately interpreted by those skilled in the art. For example, the meaning includes a case where locations of respective structures in the image of the sample S match each other and a case where regions of respective structures in the image of the sample S partially or completely overlap each other.

When the locations or the regions of the respective structures overlap each other, the control unit 151, as the structure detection unit, may execute a correction process during overlapping based on the respective structures. The example of FIG. 8 shows a case where the location or the region of the first structure 401 overlaps with the location or the region of the second structure 402, and the correction process during overlapping is performed based on the first structure 401 and the second structure 402.

By appropriately executing the correction process during overlapping, the more appropriate integration result image 203 can be obtained when the same object is detected by a plurality of models.

<Specific Example of Correction Process During Overlapping>

The correction process during overlapping may include a process of outputting information indicating that the locations or the regions overlap each other, with respect to each structure in which the locations or the regions overlap each other. In the example of FIG. 8, the rectangular frame 801 indicating the overlapping is displayed so as to surround a portion where the locations or the regions of the first structure 401 and the second structure 402 overlap each other. For example, the rectangular frame 801 is superimposed on the image of the sample S.

The information indicating that the locations or the regions overlap each other may be represented in a format other than the rectangular frame 801. For example, the format may be a circle, or may be a format other than a figure (a message and the like). Further, in the example of FIG. 8, the information indicating that the locations or the regions overlap each other is displayed in association with the locations or the regions of the first structure 401 and the second structure 402, and a display location of the information indicating that the locations or the regions overlap each other is not limited thereto.

FIG. 9 shows a state in which an example of the correction process during overlapping is executed in the integration result image 203 of FIG. 8. In this example, the correction process during overlapping includes a process of determining a location or a region of a new structure (a fourth structure 404) based on the first structure 401 and the second structure 402 whose locations or regions overlap each other. The integration result image 203 represents the location or the region of the fourth structure 404. The fourth structure 404 can be obtained, for example, as the logical sum or logical product of regions of respective structures overlapping each other. Further, for example, in the image of the sample S, a fourth representation is displayed at the location or the region of the fourth structure 404.

The fourth structure 404 is detected as, for example, a structure having two features. That is, when a certain structure is detected as both the first structure 401 and the second structure 402, it can be said that the structure is a specific structure having these two kinds of features. The correction process during overlapping may be a process of detecting the fourth structure 404 as a new type of structure different from those of the first structure 401 and the second structure 402.

A detection process under more detailed conditions can be performed by detecting a new structure corresponding to overlapping in this manner.

FIG. 10 shows a state in which another example of the correction process during overlapping is executed in the integration result image 203 of FIG. 8. In this example, the correction process during overlapping is executed by using a priority rule between the respective structures. In the example of FIG. 10, as a result of giving a priority to the first structure 401, the representation (gray) of the first structure 401 is displayed in the image of the sample S, and the representation (white) of the second structure 402 is not displayed in the image of the sample S (or is subtracted from the integration result image 203 of the state of FIG. 8).

It can be said that the correction process during overlapping is a process of preventing the location or the region of the first structure 401 or the location or the region of the second structure 402 from being included in the integration result information, with respect to the first structure 401 and the second structure 402 whose locations or regions overlap each other.

The priority rule can also be defined between three or more types of structures. For example, it is considered that the first structure is defined as a first position, the second structure is defined as a second position, and the third structure is defined as a third position. When all three types of structures overlap each other, only the representation of the first structure is displayed in the image of the sample S. When the first structure and the second structure overlap each other, and when the first structure and the third structure overlap each other, only the representation of the first structure is displayed in the image of the sample S. When the second structure and the third structure overlap each other, only the representation of the second structure is displayed in the image of the sample S.

A specific content of the priority rule (for example, the order of priority of each structure) can be input to the charged particle beam device 100, for example, in the GUI shown in FIG. 3 or in another GUI. Further, the priority rule is not limited to the order, and can be implemented by a process of calculating a priority score of each structure.

A more appropriate detection process can be performed by using the priority rule in this manner.

FIG. 11 shows a state in which still another example of the correction process during overlapping is executed in the integration result image 203 of FIG. 8. In this example, the correction process during overlapping includes a process of receiving an operation of selecting any one of the structures whose locations or regions overlap each other. For example, with respect to the first structure 401 and the second structure 402 whose locations or regions overlap each other, an operation of selecting any one of the first structure 401 and the second structure 402 is received.

In the example of FIG. 11, in a selection window 1101, a user of the charged particle beam device 100 can select the first structure 401 by operating an "A" radio button and an "OK" button, and can select the second structure 402 by operating a "B" radio button and the "OK" button.

In this manner, by allowing the user to select an appropriate structure, an appropriate detection process can be performed by human determination.

Those skilled in the art can appropriately design a process after receiving the operation of selecting the structure, and for example, as shown in FIG. 10, only the representation of the selected structure may be displayed in the image of the sample S.

Further, teacher data for the training model may be generated based on the selected structure. That is, the correction process during overlapping may include a process of generating teacher data to be used for the machine learning. For example, in the state of FIG. 11, teacher data generated when the first structure 401 is selected is teacher data indicating that the unselected second structure 402 does not appear in the image of the sample S. On the other hand, teacher data generated when the second structure 402 is selected is teacher data indicating that the unselected first structure 401 does not appear in the image of the sample S.

FIG. 12 schematically shows an example of the teacher data. In this example, the teacher data is shown in a format similar to the integration result image 203, and the format of the teacher data can be appropriately designed according to the training model. The example of FIG. 12 corresponds to the case where the first structure 401 is selected in the integration result image 203 of FIG. 8. The unselected second structure 402 among the second structures 402 (the one in the rectangular frame 801) does not appear in the image of the sample S.

The generated teacher data may be used for a new learning model or may be fed back to retrain the models in use (for example, the models M1, M2, and M3).

As described above, a more appropriate trained model can be generated by generating the teacher data according to the user's selection. Particularly, when the structures of the two types of particles are similar to each other, it may be difficult to distinguish the two types of particles by the trained model, and in this case, the teacher data for more accurately distinguishing these two types of particles can be generated.

Further, any one of the structures whose locations or regions overlap each other may be classified by a classifier. For example, the control unit 151 may function as this classifier. That is, the correction process during overlapping may include a process of selecting any one of the first structure 401 and the second structure 402 whose locations or regions overlap each other, based on the location or the region of the first structure 401 and the location or the region of the second structure 402.

A specific processing content of the classifier can be appropriately designed by those skilled in the art, and for example, the selection may be performed based on an area of a region of each structure, or more specifically, a structure having a larger area may be selected. Alternatively, when the charged particle beam device 100 performs some analysis or evaluation for each structure, the selection may be performed based on an analysis result or an evaluation result. The classifier may be configured by using an image processing technique or may be configured by using a trained model prepared for the classifier.

A process after the selection by the classifier can be appropriately designed by those skilled in the art, and for example, as shown in FIG. 10, only the selected structure may be displayed in the image of the sample S.

An appropriate structure can be efficiently selected by allowing the classifier to perform the selection in this manner.

REFERENCE SIGNS LIST

100: charged particle beam device
110: irradiation unit
111: electron source
112: lens barrel
120: sample chamber
130: detection unit
140: stage
141: sample holder
151: control unit (image generation unit, structure detection unit)
152: input unit
153: storage unit
154: display unit
160: navigation image capturing device
200: screen
201: tabular unit
202: superimposition unit
203: integration result image
204: map unit
205: symbol
206: navigation image
401: first structure
402: second structure
403: third structure 404: fourth structure
801: rectangular frame
1101: selection window
S: sample
M1: model (first trained model)
M2: model (second trained model)
M3: model (third trained model)

The invention claimed is:

1. A charged particle beam device, comprising:
an irradiation unit configured to irradiate a sample with a charged particle beam;
a particle detection unit configured to detect a particle caused by the irradiation of the sample with the charged particle beam;
an image generation unit configured to generate an image of the sample based on an output from the particle detection unit; and
a structure detection unit, wherein
the structure detection unit
inputs the image of the sample into a first trained model for detecting a first structure,
inputs the image of the sample into a second trained model for detecting a second structure,
acquires a first detection result related to the first structure from the first trained model,
acquires a second detection result related to the second structure from the second trained model,
determines a location or a region of the first structure based on the first detection result,
determines a location or a region of the second structure based on the second detection result, and
outputs integration result information representing the location or the region of the first structure and the location or the region of the second structure with different representations.

2. The charged particle beam device according to claim 1, wherein
the integration result information is represented by an integration result image representing the location or the region of the first structure and the location or the region of the second structure in the image of the sample, and
the structure detection unit generates the integration result image by displaying a first representation in the location or the region of the first structure and displaying a second representation in the location or the region of the second structure in the image of the sample.

3. The charged particle beam device according to claim 2, wherein
the first representation is implemented by a first color, and the second representation is implemented by a second color.

4. The charged particle beam device according to claim 2, wherein
the structure detection unit inputs the image of the sample into a third trained model for detecting a third structure, acquires a third detection result related to the third structure from the third trained model, and determines a location or a region of the third structure based on the third detection result, and
the integration result image is generated by further displaying the first representation or the second representation in the location or the region of the third structure in the image of the sample.

5. The charged particle beam device according to claim 1, wherein
the structure detection unit
determines the location or the region of the first structure by an image process based on the image of the sample and the first detection result, and
determines the location or the region of the second structure by an image process based on the image of the sample and the second detection result.

6. The charged particle beam device according to claim 1, wherein
the charged particle beam device analyzes the sample for a region corresponding the location or the region of the first structure or the location or the region of the second structure.

7. The charged particle beam device according to claim 1, wherein
the structure detection unit executes a correction process during overlapping based on the first structure and the second structure when the location or the region of the first structure overlaps with the location or the region of the second structure.

8. The charged particle beam device according to claim 7, wherein
the correction process during overlapping includes a process of determining a location or a region of a fourth structure based on the first structure and the second structure whose locations or regions overlap each other, and
the integration result information further represents the location or the region of the fourth structure.

9. The charged particle beam device according to claim 7, wherein
the correction process during overlapping includes a process of preventing the location or the region of the first structure or the location or the region of the second structure from being included in the integration result information, with respect to the first structure and the second structure whose locations or regions overlap each other.

10. The charged particle beam device according to claim 7, wherein
the correction process during overlapping includes a process of outputting information indicating that the locations or the regions of the first structure and the second structure, the locations or the regions of which overlap each other, overlap each other.

11. The charged particle beam device according to claim 10, wherein
the correction process during overlapping further includes a process of receiving an operation of selecting any one of the first structure and the second structure, the locations or the regions of which overlap each other.

12. A charged particle beam device, comprising:
an irradiation unit configured to irradiate a sample with a charged particle beam;
a particle detection unit configured to detect a particle caused by the irradiation of the sample with the charged particle beam;
an image generation unit configured to generate an image of the sample based on an output from the particle detection unit; and
a structure detection unit, wherein
the structure detection unit inputs the image of the sample into a first trained model for detecting a first structure, inputs the image of the sample into a second trained model for detecting a second structure, acquires a first detection result related to the first structure from the first trained model, acquires a second detection result related to the second structure from the second trained model, determines a location or a region of the first structure based on the first detection result, determines a location or a region of the second structure based on the second detection result, and outputs integration result information representing the location or the region of the first structure and the location or the region of the second structure, the structure detection unit executes a correction process during overlapping based on the first structure and the second structure when the location or the region of the first structure overlaps with the location or the region of the second structure, the correction process during overlapping includes: a process of outputting information indicating that the locations or the regions of the first structure and the second structure, the locations or the regions of which overlap each other, overlap each other; a process of receiving an operation of selecting any one of the first structure and the second structure, the locations or the regions of which overlap each other; and a process of generating teacher data used for machine learning, when the first structure is selected, the teacher data is teacher data indicating that the unselected second structure does not appear in the image of the sample, and when the second structure is selected, the teacher data is teacher data indicating that the unselected first structure does not appear in the image of the sample.

13. The charged particle beam device according to claim 7, wherein the correction process during overlapping further includes a process of selecting any one of the first structure and the second structure, the locations or the regions of which overlap each other, based on the location or the region of the first structure and the location or the region of the second structure.

* * * * *